(12) United States Patent
Meijer et al.

(10) Patent No.: US 12,299,535 B2
(45) Date of Patent: May 13, 2025

(54) METHOD AND DEVICE FOR ADDRESSING QUBITS, AND METHOD FOR PRODUCING THE DEVICE

(71) Applicant: QUANTUM TECHNOLOGIES GmbH, Leipzig (DE)

(72) Inventors: Jan Berend Meijer, Bochum (DE); Roger John, Leipzig (DE); Robert Staacke, Leipzig (DE)

(73) Assignee: QUANTUM TECHNOLOGIES GmbH, Leipzig (DE)

( * ) Notice: Subject to any disclaimer, the term of this patent is extended or adjusted under 35 U.S.C. 154(b) by 630 days.

(21) Appl. No.: 17/630,687

(22) PCT Filed: Jul. 20, 2020

(86) PCT No.: PCT/EP2020/070485
§ 371 (c)(1),
(2) Date: Jan. 27, 2022

(87) PCT Pub. No.: WO2021/018654
PCT Pub. Date: Feb. 4, 2021

(65) Prior Publication Data
US 2022/0318661 A1 Oct. 6, 2022

(30) Foreign Application Priority Data

Jul. 31, 2019 (DE) ..................... 10 2019 120 716.9

(51) Int. Cl.
*G06N 10/40* (2022.01)
*G06N 10/20* (2022.01)

(52) U.S. Cl.
CPC ............. *G06N 10/40* (2022.01); *G06N 10/20* (2022.01)

(58) Field of Classification Search
CPC ........ G06N 10/40; G06N 10/20; G06N 10/00; B82Y 10/00; H01L 29/401;
(Continued)

(56) References Cited

U.S. PATENT DOCUMENTS 6,803,599 B2 * 10/2004 Amin ..................... B82Y 10/00
365/162
10,217,057 B2 * 2/2019 Barends ..................... F41J 1/10
(Continued)

FOREIGN PATENT DOCUMENTS

DE 102009033566 A1 1/2011
DE 102010053575 A1 6/2012

OTHER PUBLICATIONS

Garelli M S et al, "Buckyball Quantum Computer: Realization of a Quantum Gate", arxiv.org, Cornell University Library, 201 OLIN Library Cornell University Ithaca, NY 14853,Jan. 14, 2005 (Jan. 14, 2005), XP080189373, DOI: 10.1140/EPJB/E2005-00397-6.
(Continued)

*Primary Examiner* — Nha T Nguyen

(57) ABSTRACT

A method of addressing at least one qubit to be addressed in a set of two or more qubits includes exposing the qubit to be addressed to an electromagnetic field; and at a same time exposing another qubit of the set of two or more qubits to an electromagnetic counter field in such a way that the electromagnetic field has no effect on the other qubit or that the electromagnetic field has a different effect on the other qubit than on the qubit to be addressed. A device for performing the method includes the set of two or more qubits and electromagnetic sources for generating the electromagnetic field and electromagnetic counter field.

6 Claims, 4 Drawing Sheets

(58) Field of Classification Search
CPC ......... H01L 21/02527; H01L 21/02576; H01L 29/1602; H01L 29/66977; H10N 60/01
See application file for complete search history.

(56) References Cited

U.S. PATENT DOCUMENTS

| | | | |
|---|---|---|---|
| 10,418,443 B1* | 9/2019 | Nordquist | H01L 29/66977 |
| 10,657,456 B1* | 5/2020 | Kharzeev | H01F 38/14 |
| 10,726,351 B1* | 7/2020 | Li | G06N 10/00 |
| 11,580,435 B2* | 2/2023 | King | G06N 10/00 |
| 2005/0167772 A1 | 8/2005 | Stoneham et al. | |
| 2016/0267032 A1* | 9/2016 | Rigetti | G06F 13/4068 |
| 2017/0018312 A1* | 1/2017 | Benjamin | G06N 10/00 |
| 2018/0225586 A1* | 8/2018 | Chow | H03K 19/1958 |
| 2019/0165241 A1* | 5/2019 | Rosenblatt | H01L 25/0657 |
| 2019/0205784 A1* | 7/2019 | Monroe | G06N 10/00 |
| 2020/0335685 A1* | 10/2020 | Shao | H10N 60/01 |

OTHER PUBLICATIONS

Lilian Childress et al, "Diamond NV centers for quantum computing and quantum networks", M R S Bulletin, Band 38, Nr. 2, Feb. 1, 2013 (Feb. 1, 2013), Seite 134-138, XP055738266, DOI: 10.1557/mrs.2013.20 external link ISSN:0883-7694.
Written Opinion dated Oct. 22, 2020 re PCT/EP2020/070485 (12 pages).
International Search Report dated Oct. 22, 2020 re PCT/EP2020/070485 (7 pages—original with English translation).
Wolf, Michael S. dissertation titled "Coupling Nitrogen-Vacancy Center Spins in Diamond to a Ferromagnetic Vortex," dated May 2017 (date of defense Apr. 4, 2017) (159 pages).

* cited by examiner

METHOD AND DEVICE FOR ADDRESSING QUBITS, AND METHOD FOR PRODUCING THE DEVICE

CROSS REFERENCE TO RELATED APPLICATIONS

The present patent application is a national stage of, and claims priority to, Patent Cooperation Treaty Application No. PCT/EP2020/070485, filed on Jul. 20, 2020, which application claims the priority of the German patent application DE 10 2019 120 716.9, filed on Jul. 31, 2019, the disclosures of which are incorporated in the present patent application by reference.

TECHNICAL FIELD

The present disclosure relates to a method for addressing qubits according to the preamble of an independent claim, a device for addressing qubits according to the preamble of another independent claim and a method for producing the device according to the preamble of another independent claim.

BACKGROUND

Quantum computers offer the possibility of solving special problems with the aid of quantum mechanical effects. A difference to a conventional computer is the use of quantum bits (qubits), which are the equivalent of bits in a classic computer. The consideration of bits shows that they can only assume two states. These two states are 0 and 1.

Qubits, on the other hand, can not only assume the status 0 and 1, but also assume an intermediate status between 0 and 1 within a certain period of time (coherence time). This state is called superposition.

In contrast to the classic bits of today's computers, qubits can process much more information and therefore offer the potential for computers with unprecedented computing capacity. The production of such qubits is currently a topic in science in which a lot of research is invested. Scientists are looking for the best way to produce qubits and to connect them to one another to form arithmetic units according to the quantum laws.

Qubits can currently be implemented using different methods. Superconducting qubits are known that are easy to set up and scalable. Up to 20 qubits have been entangled in this way. However, there are only extremely short T2 times (Transversal relaxation time—spin-spin relaxation) and cooling to 4° K (−273° C.) must be ensured, which is why the computers must be installed in rooms specially provided for this purpose in order to provide cooling and to ensure the highest possible protection against vibrations, electrical stray fields and residual heat.

Qubits via ion traps are easy to control and have extremely long T2 times. Between 10 and 20 qubits have been entangled in this way. However, they are not scalable and technically very complex.

NMR quantum computers have also been investigated, with 5 qubits being entangled. These are characterized by very simple programming, but they are not scalable and the technology behind them is very complex.

SUMMARY

Solid-state-based quantum bits have so far been the only way to circumvent the disadvantages mentioned above, because a quantum computer operated with solid-state-based qubits enables operation at room temperature. In addition, it is scalable and CMOS-compatible, which is why a good connection to previously used semiconductor technologies is possible.

The present disclosure is based on such solid-state-based qubits. The currently most promising variant of solid-based qubits is the use of nitrogen vacancy centers (NV centers) in diamonds. Diamonds offer various mechanical features, such as very high hardness, thermal conductivity and reaction resistance.

In recent years research has made it possible to produce diamonds via chemical vapor deposition (CVD). The synthetic production offers the advantage that diamonds with a high isotope purity and certain crystal defects can be created. The diamonds can be equipped with application-specific optical and electronic attributes. These attributes of the diamonds, which can now be determined, are of great importance for quantum mechanics and are widely used there.

A two-dimensional grid of NV centers can be created in synthetic diamonds. The nuclear spins of the nitrogen atoms act as qubits; Readout and coupling take place via the electronic spin of the NV center, whereas the coupling being achieved through the magnetic dipole interaction; Inhomogeneous magnetic fields enable individual quantum gate and parallel gate operations on many qubits.

However, addressing individual gate operations and reading out the individual qubits is a particular problem. Local addressing (shifting the resonance frequency by at least one line width) is usually made possible by using magnetic fields or different orientations of the qubits. The necessary shift depends on the T2 time. The problem here is that when using resonance shifting, the influence of neighboring qubits, a so-called crossover or crosstalk, cannot be completely avoided.

An alternative is optical addressing, as described, for example, in U.S. Pat. No. 9,317,473 B2. Addressing is done optically. To ensure that there is no crosstalk between different qubits (registers), they must be arranged sufficiently far apart (400 nm to 500 nm). For these distances, however, no direct entanglement of the qubits can take place, so that the entanglement via a so-called dark spin chain of optically non-addressable spins must be used. If, on the other hand, the distance is sufficiently small that direct entanglement can take place, then the addressing will take place via near-field microscopy (spin resolft). The indirect entanglement, however, involves functional risks and the use of near-field microscopy for each individual register is very complex. In addition, crosstalk cannot be ruled out in both cases It is therefore the object of the present disclosure to enable qubits to be addressed in a simple manner without the risk of crosstalk. In particular, it should also be possible to easily read out the qubits.

This objective is achieved with the method according to an independent claim, a device according to another independent claim, and a manufacturing method for the device according to another independent claim.

Advantageous developments are given in the dependent claims and in the following description together with the figures.

It was recognized that this object can be achieved in a surprising manner in that the addressing of a qubit takes place via an electromagnetic field, whereas the qubits, that are not to be addressed, are shielded by adapted electromagnetic counter. As a result, each individual qubit of a set of two or more qubits can be addressed very precisely and at the same time easily, even if these are arranged relatively close to one another for the purpose of direct entanglement.

The method of addressing at least one qubit in a set of two or more qubits is characterized in that the qubit to be addressed is exposed to an electromagnetic field, while at least one other qubit of the set of qubits is exposed to an opposing electromagnetic field in such a way that the electromagnetic field has no effect on the other qubit (for the purpose of pure shielding of this other qubit) or that the electromagnetic field has a different effect on the other qubit than on the qubit to be addressed (for the purpose of different addressing).

In this context, "addressing" is understood to mean not only the selection of a qubit to change its state, but also the actual change in its state as part of a quantum gate operation (also called quantum gate operations). Single gate or two or more gate operations are possible as gate operations; the latter usually takes place depending on the state of a qubit (example CNOT Gate). The "method for addressing a qubit" is therefore, more precisely, a "method for selecting a qubit and/or for changing the state of a qubit".

Addressing is therefore carried out by selecting the desired qubits and performing quantum gate operations on these qubits. Meanwhile, the other qubits are shielded or the counter fields are adjusted so that their own quantum gate operations are optimized.

Quantum gate operations are based e.g. on the change in the spin state of the qubit by the influence of a time-varying magnetic field of a certain duration. The pulse shape is set in such a way that a well-defined state with a low error rate is achieved. In the case of entangled qubits for register control and error correction multiple qubits can be addressed at the same time. Typically, a carrier frequency in a frequency range of 500 MHz up to 50 GHz for electron spin systems and a frequency range of 1 kHz-100 MHz for nuclear spin systems is used for the pulse shapes. The exact procedure for the quantum gate operations is not the subject of this disclosure. It can be depicted from the article "Protecting a Diamond Quantum Memory by Charge State Control" by M. Pfender et al., Nano Lett. 2017, 17, 10, 5931-5937 for example, the relevant content of which is hereby included in full.

The electromagnetic fields and the electromagnetic opposing fields are specially coordinated depending on the electromagnetic source and the position of the qubits in relation to this source in order to achieve the desired addressing or non-addressing for the qubits. Due to the linearity of the Maxwell equations, different individual addressing of each individual qubit can take place.

The following addressing types can be implemented in detail:
  each qubit can be addressed separately at a certain point in time, while the other qubits are not addressed,
  two or more qubits can be addressed identically at the same time, while the other qubits are not addressed,
  two or more qubits can be addressed differently at the same time, while the other qubits are not addressed,
  two or more qubits can be addressed identically at the same time, while at the same time at least one further qubit is addressed differently and the other qubits are not addressed,
  two or more qubits can be addressed identically at the same time, while the remaining qubits are addressed differently at the same time,
  all qubits can be addressed differently at the same time.

There is no crosstalk between the addressing of the qubits due to the electromagnetic counter fields that are specially adapted for each qubit in relation to the addressing of the other qubits. Each qubit can therefore be exposed to electromagnetic fields and electromagnetic counter fields at the same time, whereby the desired quantum gate operation and shielding are achieved due to the superposition of the electromagnetic fields and electromagnetic counter fields at the same time.

The electromagnetic field itself does not have to serve exactly a quantum gate operation on one qubit and the electromagnetic counter field does not have to exactly shield the other qubit, but mixed forms are possible, for example the electromagnetic field of one qubit and the electromagnetic counter field of the other qubit can be used to implement the quantum gate operation of the other qubit.

In an advantageous development it is provided that the electromagnetic field and the opposing electromagnetic field are amplitude-modulated, with a temporal variation between the modulation of the electromagnetic field and the electromagnetic counter field. This makes the method particularly easy and effective to implement.

In an advantageous development it is provided that electromagnetic near fields are used as the electromagnetic field and as the electromagnetic counter field, the electromagnetic near fields preferably being magnetic near fields which in particular have a frequency in the microwave range and/or kilohertz range. Electromagnetic near fields couple very well to neighboring qubits, whereby the Laplace equations result in a maximum field exaggeration in the vicinity of the source of the electromagnetic near field. These near fields are independent of the wavelength of the electromagnetic field used or of that of the electromagnetic counter field and can be locally amplified or limited by superimposition. Fields in the kilohertz range (range 0 kHz to 1 GHz) can be used to address the nuclear spins, while fields in the microwave range (range 0 GHz to 50 GHz, preferably in the range 2.87 GHz) can be used to address the electron spins.

In an advantageous development, it is provided that color centers, preferably NV centers in the diamond, are used as qubits. These can be produced particularly easily and with high conversion rates, as shown in DE 10 2019 117 423.6, the content of which in this regard is hereby fully incorporated.

In an advantageous development it is provided that electromagnetic sources, preferably electrically conductive structures, which are assigned to individual qubits, are used to provide the electromagnetic fields and electromagnetic counter fields. Through this the electromagnetic fields and opposing fields can be particularly easily assigned locally to each individual qubit.

In an advantageous further development, it is provided that the electrically conductive structures are provided as lines, metallizations, wires or the like for an electromagnetic field, preferably an electromagnetic high frequency field. For this purpose, the conductive structures should in particular be capable of transferring high frequencies. For this purpose, the conductive structures preferably have a smaller dimension (diameter—the length can be greater) than the distance between adjacent qubits. This facilitates implementing the method.

In an example, color centers are used as qubits, whereas the electromagnetic fields and electromagnetic counter fields being provided by electrically conductive structures which have a smaller dimension than the distance between adjacent qubits. This facilitates the addressing of the qubits.

In an advantageous development it is provided that there is an identical number of conductive structures to the number of qubits. However, there does not necessarily have to be an identical number of conductive structures to the number of qubits, because the fields from different conductive structures can be superimposed and gradient fields can also be formed.

So that the system is not underdetermined, an additional electric quasi-static field can be generated on the conductive structures and achieve addressing can via the strong effect or the Zeeman effect for example. This leads to a defined frequency shift and makes the other qubits virtually invisible to the electromagnetic fields. In a simple case, a defined bias is applied to a line (e.g. 10 V) and only at the crossing point do the voltages (20 V) add up and cause a tuned frequency of the electromagnetic field. This would also make it possible, for example, to perform quantum gate operations on two or three qubits at the same time. Any errors that occur due to pulses associated with bias changes could then be corrected using several time-separated pulse sequences. For example, a field of 9 qubits, which are arranged as an orthogonal 3×3 grid in one layer, could be addressed by 6 first electrically conductive wires, which consist in two layers, each layer having 3 first electrically conductive wires arranged parallel to one another; the wires in one layer are orthogonal to the wires in the other layer and the individual wires are arranged so as to be electrically insulated from one another.

The wires preferably each run parallel to a line of qubits. Generally speaking, grids of X*Y qubits can be addressed by at least two layers of at least X lines or Y lines respectively. The grid and the wires do not necessarily have to be arranged orthogonally; they can also be arranged at an angle. In this case, addressing is achieved, for example, by an electric field via the Stark effect or by a semi-static magnetic field via the Zeeman effect. In both cases the resonance frequency of the qubits is changed, which in turn leads to a selection effect.

On the other hand, in the case of a three-dimensional orthogonal or inclined arrangement of the qubits (X*Y*Z), addressing could be performed by at least three orthogonal or inclined layers of at least X, Y and Z wires. Here, too, the wires preferably run parallel to a line of qubits.

In principle, it is sufficient if there is a separate electrically conductive structure, for example a wire, a line, or a metallization, for each qubit.

However, by arranging the qubits in 2 or 3-dimensional grids, the number of electrically conductive structures required can be reduced. The individual electrically conductive structures must be arranged electrically insulated from one another in each case, which can be achieved, for example, by an insulator material within a layer between individual electrically conductive structures and an insulator layer between different layers with electrically conductive structures.

The electromagnetic sources or conductive structures can be used at the same time to read out the qubits, for which purpose photoelectrons are generated in the qubit to be read by means of a light pulse and are detected via the electromagnetic sources or conductive structures.

To achieve this at least one additional electrical grounding should be provided in addition. This grounding can comprise, for example, a backside contact of a thin layer, whereas the qubits exist in the thin layer, or there are one or more other conductive structures that are grounded. The exact read out procedure is not subject of this disclosure.

It can be found, for example, in the article "Photoelectrical imaging and coherent spin-state readout of single nitrogen-vacancy centers in diamond" by P. Siyushev et al., Science, 363, 6428, 728-731, the corresponding content of which is hereby fully included.

In an example, it is provided that the qubits consist in a transparent material so that the qubits can be formatted, preferably several, in particular all, qubits at the same time by means of optical radiation, preferably LASER radiation as described, for example, in the article "Photoelectrical imaging and coherent spin-state readout of single nitrogen—vacancy centers in diamond" by P. Siyushev et al., Science, 363, 6428, 728-731, the relevant content of which is hereby fully incorporated.

If conductive structures are used as electromagnetic sources, then these should be made as transparent as possible so as not to shadowing the radiation. For example, it could be lines or wires made of a metal oxide such as ITO (indium zinc oxide). In the case of non-transparent conductive structures, these can be dimensioned in such a way that the irradiation can reach the corresponding qubit by diffraction.

Independent protection is claimed for the device according to the disclosure for addressing at least one qubit in a quantity of two or more qubits, which is characterized in that there are means for generating an electromagnetic field which are designed so that the qubit to be addressed can be exposed to the electromagnetic field, and that means for generating at least one electromagnetic counter field exist, which are designed so that at least another qubit of the set of qubits can be exposed to the electromagnetic counter field in such a way that the electromagnetic field of the qubit to be addressed has no effect on the other qubit or that the electromagnetic field has a different effect on the other qubit than on the qubit to be addressed.

In an example, it is provided that the device is adapted to carry out the method according to the disclosure.

In an example, it is provided that first electromagnetic sources, preferably first electrically conductive structures, in particular lines, wires, metallizations and the like, exist for generating the electronic magnetic fields and the electromagnetic counter fields, with each qubit having assigned at least one electromagnetic source, preferably a first electrically conductive structure. This facilitates assigning the electromagnetic fields and counter fields to the individual qubits.

In an example, it is provided that several first electromagnetic sources, preferably first electrically conductive structures, in particular in the form of wires, are arranged in one layer, whereas the qubits have assigned a distance perpendicular to this layer from their respective electromagnetic source at most 30 nm, preferably of at most 20 nm, in particular in the range from 0 nm to 10 nm.

As a result, electromagnetic near fields can be generated particularly easily, which couple very strongly to the neighboring qubit, whereby the Laplace equations result in a maximum field exaggeration. These near fields are independent of the wavelength of the electromagnetic field used or of the counter field used and can be locally strengthened or limited by superimposing them.

In an example, it is provided that at least one first electrically conductive structure can optionally be connected to electromagnetic excitation or photoelectron detection. As a result, the electrically conductive structures can be used both for addressing and for reading.

In an example, it is provided that several first electromagnetic sources, preferably first electrically conductive structures, in particular in the form of wires, are arranged in one layer, whereas the qubits projected onto this layer have a distance from the respectively assigned first electromagnetic source of at most 20 nm, preferably of at most 10 nm, in particular in the range from 0 nm to 5 nm. This also makes it particularly easy to generate electromagnetic near fields that are very strongly coupled to the neighboring qubit, whereby a maximum field exaggeration appears because of the Laplace equations. These near fields are independent of the wavelength of the electromagnetic field used or of the counter field and can be locally strengthened or limited by superimposing them.

In an example, it is provided that there is at least one second electrically conductive structure, preferably a second electrically conductive wire, a line or a metallization or an electrode that forms the ground for reading out the qubits, the second electrically conductive structure being preferably arranged adjacent to a first electromagnetic source, in particular at a distance in a layer of at most 40 nm, preferably at most 30 nm, in particular in a range from 10 nm to 20 nm.

In an example, it is provided that there is at least one second electrically conductive structure as the back contact of a relatively thin layer, a layer thickness of at most 100 nm, preferably at most 80 nm, in particular at most 60 nm, being recommended for diamond. This makes reading out particularly efficient.

In an example, it is provided that the first electrically conductive wires and/or the second electrically conductive wires i) have a cross section with a longitudinal dimension of less than 50 nm, preferably less than 20 nm, in particular in the range 1 nm to 10 nm and/or ii) a length of less than 50 nm, preferably less than 30 nm, in particular have from 5 nm to 20 nm. This enables electromagnetic near fields to be generated particularly well.

In an example, it is provided that the qubits are arranged in one, two or three dimensions. This allows numerous qubits to be interlaced with one another and still addressed independently of one another.

In an example, it is provided that the electrically conductive structures are arranged one-dimensional, two-dimensional or three-dimensional, whereby there are preferably two or more layers exist in which electrically conductive wires are arranged in particular parallel to one another and whereas the electrically conductive structures of different layers are arranged differently and whereas preferably electrical insulator is arranged between two layers. This allows the qubits to be easily addressed and read out again.

The electrically conductive structures on different layers are preferably arranged at an angle to one another, preferably orthogonally to one another, because electromagnetic fields with elliptical or circular polarization can then be generated, which allow the generation of qutrits (double quantum transitions, cf. the article "Room temperature entanglement between distant single spins in diamond "by F. Dolde et al., Nature Physics, 9, 139-143 (2013)).

In an example, the qubits are color centers, whereas the means for generating the electromagnetic fields and the counter electromagnetic fields comprise electrically conductive structures which have a smaller dimension than the distance between adjacent qubits. This facilitates addressing the qubits.

Furthermore, independent protection is claimed for the method for manufacturing the device according to the disclosure, which is characterized in that two or more qubits are generated in a surrounding material and first electrically conductive structures are arranged on the surrounding material.

In an example, it is provided that at least one of the following steps is also carried out:
Choice of a diamond layer (as a bulk material or as a layer on a substrate) as the surrounding material,
Doping of the surrounding material with a dopant, preferably sulfur, phosphorus or oxygen,
Carrying out a first tempering process step after doping,
Carrying out a second tempering process step after generating the qubits,
Application of second electrically conductive structures for reading out the qubits.

More detailed information on the generation of the qubits can be found in DE 10 2019 117 423.6.

The electrically conductive structures, such as lines, wires and metallizations, can be produced using various methods. On the one hand, printing is possible. Then they can be applied through stencil masks.

In assitiob wires can be written directly too, for example with an AFM tip, as described in the article "Atomic force microscope integrated with a scanning electron microscope for correlative nanofabrication and microscopy" by I. W. Rangelow et al., J. Vac. Sei. Technol. B 36 (6), November/December 2018.

In an example, the generation of the qubits can include the implantation of foreign atoms, which corresponds to the procedure described in the publication "Nanoscale Engineering and Optical Addressing of Single Spins in Diamond", S. Pezzagna et al., Small 2010, 6, no. 19, 2117-2121, the method is carried out using an AFM tip because it enables the qubits to be positioned very precisely.

In an example, color centers are produced as qubits and the electrically conductive structures are produced in such a way that they have a smaller dimension than the distance between adjacent qubits. This facilitates addressing the qubits.

The features and further advantages of the present disclosure will become clear in the following on the basis of the description of examples in connection with the figures.

DESCRIPTION

Figure 1:
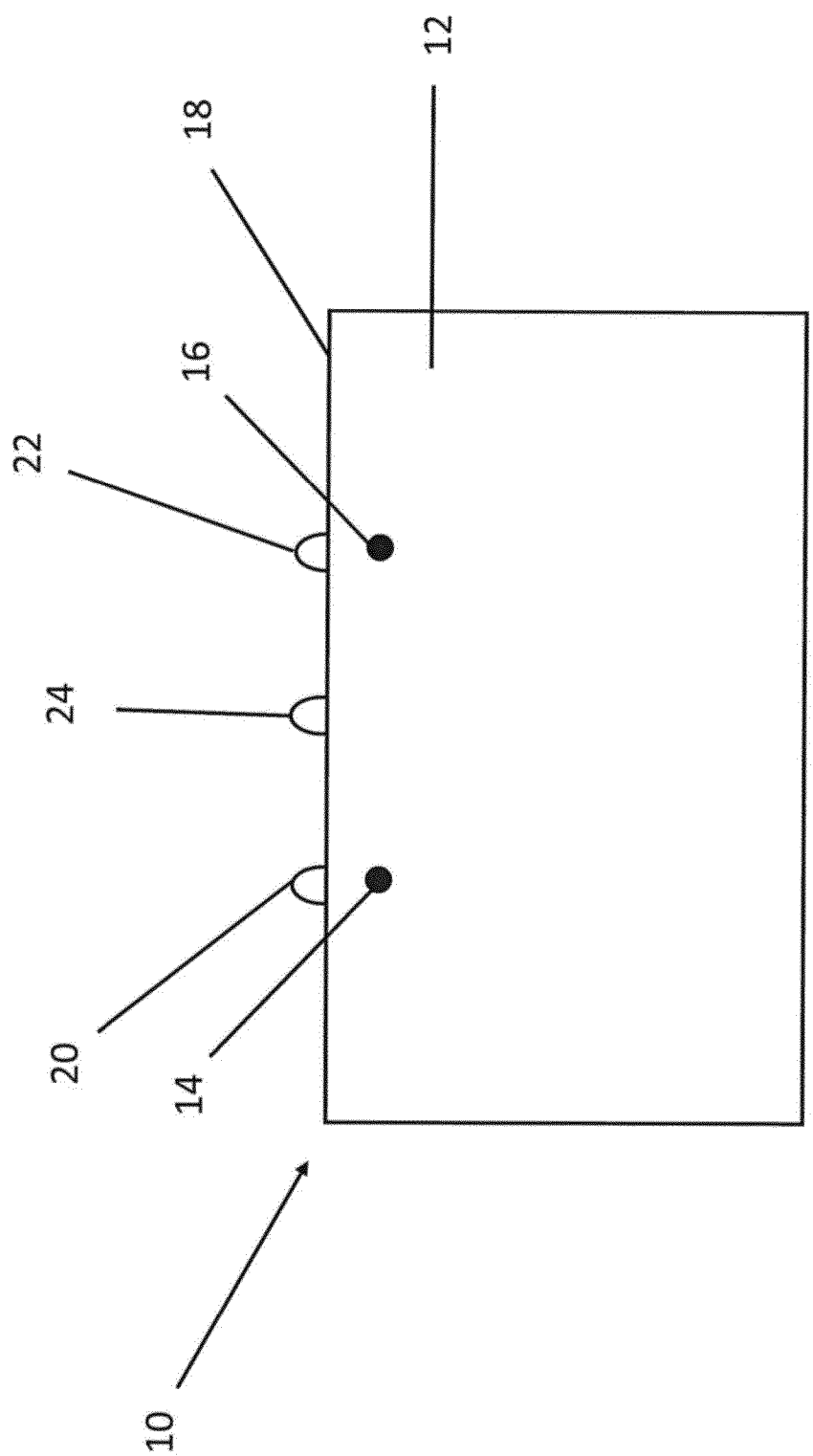
FIG. 1 shows an example device in a view from above.
Figure 2:
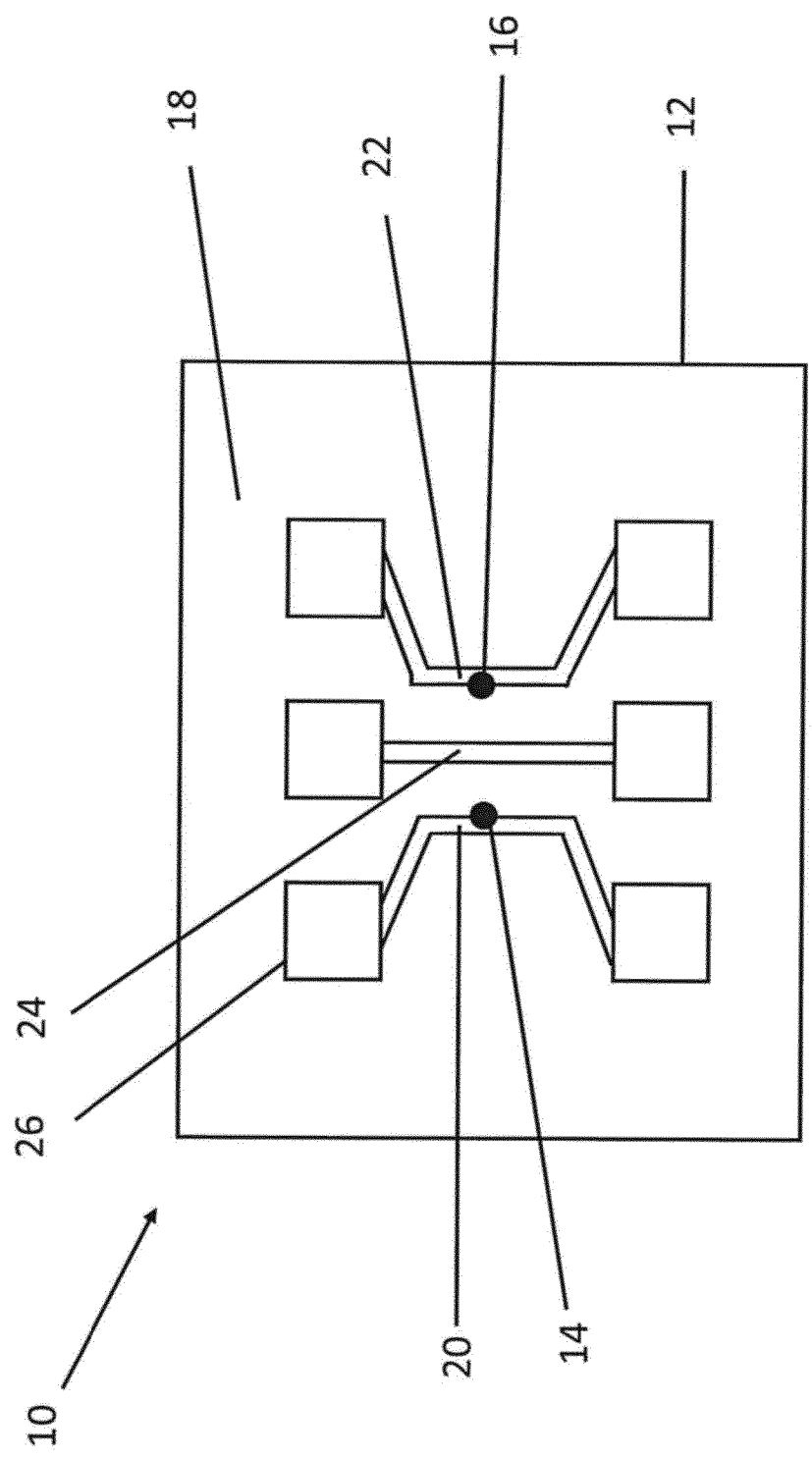
FIG. 2 shows the example device according to FIG. 1 in a sectional side view.

In FIGS. 1 and 2, a first an example the device 10 is shown in more detail. It can be seen that the device 10 has a diamond bulk material 12 in which two qubits 14, 16 are arranged at a depth of approximately 10 nm below the surface 18 of the diamond material 12. First electrically conductive wires 20, 22 made of ITO (indium tin oxide) are arranged directly above the two qubits 14, 16. There is also a second electrically conductive wire 24 made of tungsten.

For making contact, the wires 20, 22, 24 each have corresponding contact areas 26 to which electrical connections (not shown) can be bonded. The first two wires 20, 22, which are used for addressing and reading out the two qubits 14, 16, are spaced approximately 20 nm to 30 nm apart, which thus also corresponds to the spacing between the two qubits 14, 16. As a result, these qubits 14, 16 can easily become entangled.

The second wire 24, which forms the ground for reading out the qubits 14, 16, is arranged centrally between the two first wires 20, 22 and is thus at a distance of 10 nm to 15 nm from these first wires 20, 22.

All of the wires 20, 22, 24 are arranged plane-parallel to one another on the surface 18. They have in the straight region (cf. FIG. 2) between the contact surfaces 26 a length of 5 nm to 30 nm, preferably 20 nm and a height and width in the range 1 nm to 10 nm, preferably 5 nm.

The device 10 now functions in such a way that simultaneous formatting of the qubits 14, is given by a suitable LASER pulse through the surface 18, which easily reaches the qubits 14, 16 through the transparent wires 20, 22 made of ITO. A spin polarization takes place due to the laser pulse and all qubits 14, 16 go into the ground state. This gives you a defined and known initial state (formatting).

Alternatively, the wires 20, 22 could also be formed from silver or gold, for example, with the LASER pulse then being diffracted around these wires 20, 22 due to the very narrow dimensions of the wires 20, 22, so that the LASER-Pulse reaches qubits 14, 16 for formatting. The qubits 14, 16 can then be addressed individually or together.

For this purpose, a suitable high-frequency current is applied to the contacts 26 of the respective wires 20, 22, which is in the kilohertz range for addressing the core spins of the qubits 14, 16. The current flowing in the wires 20, 22 induces a magnetic field that acts on the respective qubit 14, 16.

In the immediate vicinity of the wires 20, 22, a magnetic near field is formed which, due to the Laplace equations, is superelevated in the area of the qubits 14, 16 arranged next to each other and therefore influences particularly good the nuclear spins of these qubits 14, 16. The appropriate magnetic near field is fed to each qubit 14, 16, whereby it is addressed. At the same time, the respective other qubit 16, 14 is fed a counter-magnetic field that compensates for the magnetic field components of the magnetic near fields used to address the qubits 14, 16 at the location of the respective other qubits 16, 14 so that no cross-talk can take place. As a result, on one side both qubits 14, 16 can be addressed differently or identically at the same time, and on the other side addressing of only a single qubit 14, 16 can take place independently of the addressing of the other qubit 16, 14.

To read out the qubits 14, 16, for example, a suitable uniform LASER irradiation could again take place, whereby photoelectrons are generated in both qubits 14, 16, which are then skimmed off and measured via the respectively assigned first wires 20, 22, whereas the second wire 24 serves as a ground. For this purpose, there are changeover switches, so that the wires 20, 22 can be used once for formatting (i.e. supplying current) and once for reading out (i.e. measuring current).

Alternatively, suitable LASER pulses could also be fed separately to each qubit 14, 16 by suitable lighting means, so that the qubits 14, 16 can be read out individually.

The manufacture of the device 10 could, for example, take place as follows: A manufacture of the qubits 14, 16 is carried out with doping of the diamond 12 with subsequent first and second temperature treatment process steps according to DE 10 2019 117 423.6, whereas the steps of contacting the second wire 24 and the masking and contacting the first wires 20, 22 are suitably integrated in this manufacturing process.

More precisely, a diamond 12 is doped with sulfur or another suitable dopant and subjected to a first tempering step at approximately 1000° C. Subsequently, the second wire 24 made of tungsten is vapor deposited on the surface 18 of the diamond 12 together with the respective contact surfaces 26, for example by means of a removable mask.

Thereafter, a contact mask (not shown in FIG. 1 for the sake of clarity) made of glass or silicon carbide is arranged on the surface 18 of the diamond 12 which is provided with the second wire 24 and which has two openings which are in the shape of the first wires 20, 22, and which are arranged at the desired distance from the second wire 24.

Corresponding mask production methods are familiar to the person skilled in the art, so that they do not have to be discussed in more detail.

An implantation of nitrogen takes place through this mask in order to generate the qubits 14, 16. As a result, the position of the qubits 14, 16 under the first wires 20, 22 formed later is also precisely specified.

After a second temperature control step at about 800° C., the first wires 20, 22 are vapor deposited through the mask together with the respective contact surfaces 26 made of ITO and the device 10 is thus finished.

Figure 3:
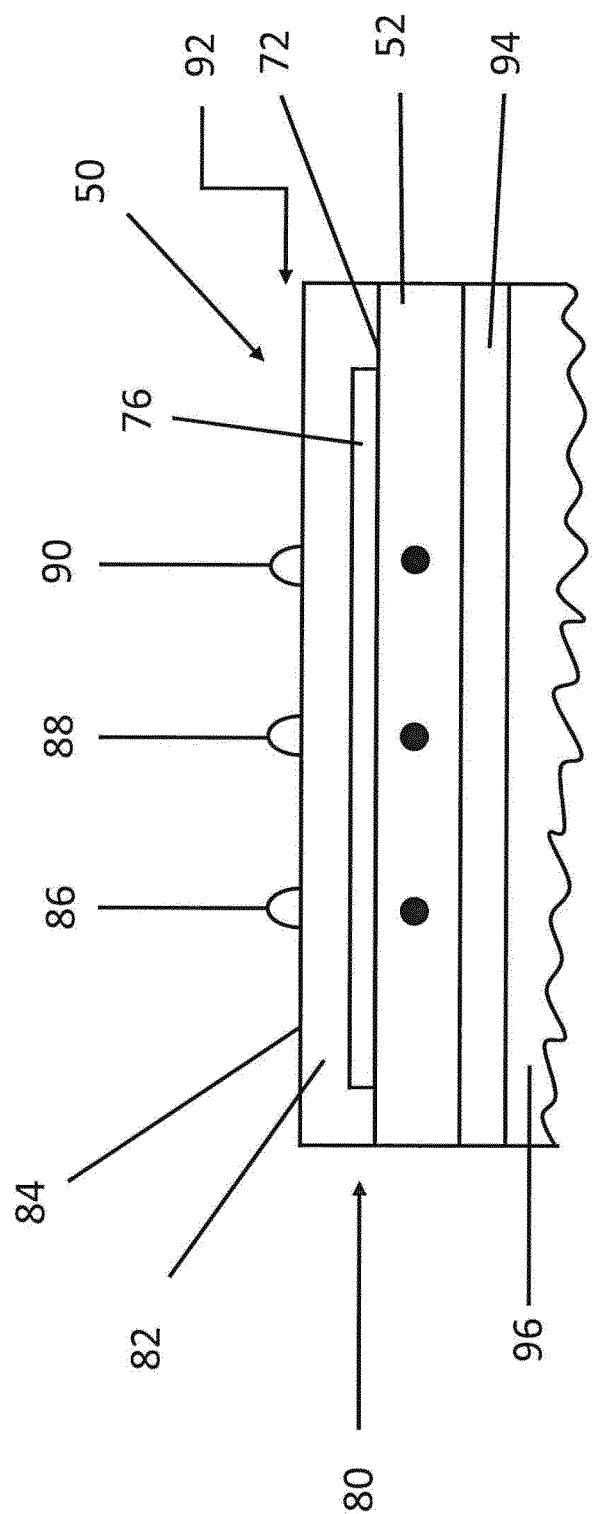
FIG. 3 shows an example device in a view from above.
Figure 4:
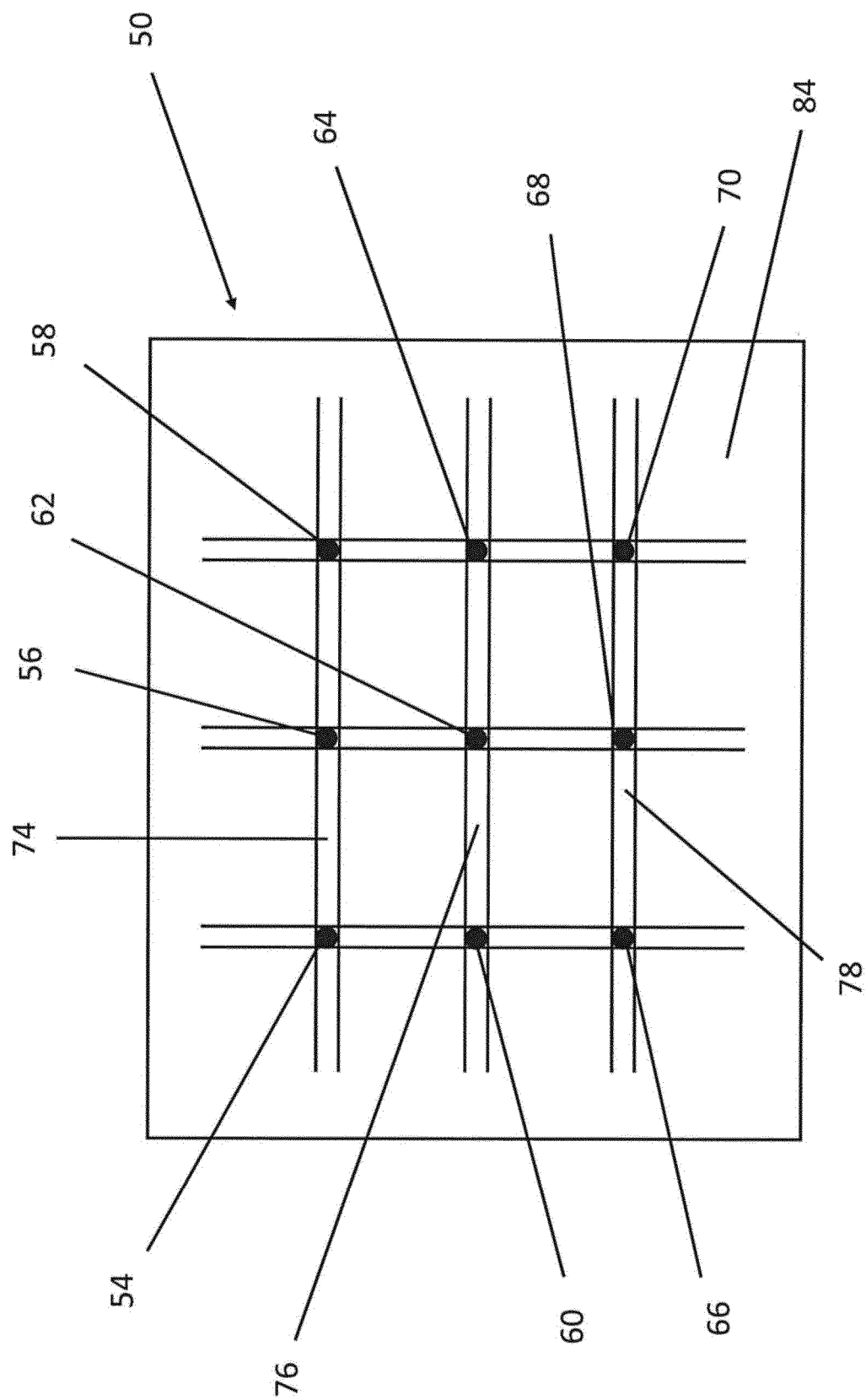
FIG. 4 shows the example device according to FIG. 3 in a sectional side view.

In FIGS. 3 and 4, an example of the device 50 is shown in more detail.

From FIGS. 3 and 4 it can be seen that the device 50 has a diamond layer material 52 in which nine qubits 54, 56, 58, 60, 62, 64, 66, 68, 70 are arranged at a depth of approx. 10 nm below the surface 72 of the diamond material 52. Directly above the nine qubits 54, 56, 58, 60, 62, 64, 66, 68, 70, three first electrically conductive wires 74, 76, 78 made of ITO are arranged in a first layer 80. These first wires 74, 76, 78 are covered with an insulator layer 82 which can be formed, for example, from an oxide, in particular $SiO_2$. On the surface 84 of the insulator layer 82, three further first electrically conductive wires 86, 88, 90 are arranged in a second layer 92.

The wires 74, 76, 78 in the first layer 80 are aligned plane-parallel to one another and the wires 86, 88, 90 in the second layer 92 are aligned plane-parallel to one another. The wires 74, 76, 78 of the first layer 80 are oriented orthogonally to the wires 86, 88, 90 of the second layer 92 and all of the wires are electrically isolated from one another. Corresponding contact surfaces have not been shown here to simplify the illustration. These first electrically conductive wires 74, 76, 78, 86, 88, 90 also have a height and width in the range from 1 nm to 10 nm, preferably 5 nm. The length of the straight sections of the wires 74, 76, 78, 86, 88, 90 extends approximately 5 nm to 10 nm beyond the outer qubits 54, 56, 58, 60, 64, 66, 68, 70, respectively.

These first electrically conductive wires 74, 76, 78, 86, 88, 90 are in turn used for addressing and reading out the qubits 54, 56, 58, 60, 62, 64, 66, 68, 70 and are spaced approximately 20 nm apart up to 30 nm in the respective layer 80, 92, which corresponds to the distance of the qubits 54, 56, 58, 60, 62, 64, 66, 68, 70 directly arranged below the virtual intersection points of the wires 74, 76, 78, 86, 88, 90 (cf. FIG. 4). Due to the distance of 20 nm to 30 nm, the qubits 54, 56, 58, 60, 62, 64, 66, 68, 70 can easily entangle.

Instead of one or more second electrically conductive wires, as in the device 10 according to FIGS. 1 and 2, there is a common rear-side contact 94, for example made of tungsten, which is located between the diamond layer 52 and a substrate 96. This rear contact 94 serves as a common ground for reading out the individual qubits 54, 56, 58, 60, 62, 64, 66, 68, 70.

The device 50 now functions in such a way that simultaneous formatting of the qubits 54, 56, 58, 60, 62, 64, 66, 68, 70 through surface 84 is performed by an appropriate LASER pulse which easily reaches the qubits 14, 16 through the transparent wires 74, 76, 78, 86, 88, 90 made of ITO.

The addressing of the individual qubits 54, 56, 58, 60, 62, 64, 66, 68, 70 can now be done by assigning each qubit 54, 56, 58, 60, 62, 64, 66, 68, 70 two first wires 74, 76, 78, 86, 88, 90, whereby by different suitable signals on the respectively crossing first wires 74, 76, 78, 86, 88, 90 each individual qubit 54, 56, 58, 60, 62, 64, 66, 68, 70 can be addressed individually through the individually developing magnetic near fields. More precisely, the qubits 54, 56, 58, 60, 62, 64, 66, 68, 70 are located in the vicinity of intersection points of first wires 74, 76, 78, 86 with respect to a projection onto the layers 80, 92, 88, 90, so that in the crossing wires 74, 76, 78, 86, 88, 90 applied magnetic high frequency fields are superimposed so that for each qubit 54, 56, 58, 60, 62, 64, 66, 68, 70 individual magnetic near fields appear. By means of individually adapted magnetic counter fields in these individual near fields, the influences of the magnetic near fields of the respective remaining qubits 54, 56, 58, 60, 62, 64, 66, 68, 70 are eliminated or sufficiently reduced.

The crossing wires 74, 76, 78, 86, 88, 90 can generate elliptically or circularly polarized magnetic near fields for each qubit 54, 56, 58, 60, 62, 64, 66, 68, 70 so that Qutrite states can be produced.

For example, for the purpose of reading out qubits 54, 56, 58, 60, 62, 64, 66, 68, 70, a suitable LASER pulse is used, with first wires 74, 76, 78, 86, 88, 90 being switched from a current supply to a current measurement and the back contact serving as a ground for the generated photoelectrons. By combining the individual measurement signals of the first wires 74, 76, 78, 86, 88, 90, each qubit 54, 56, 58, 60, 62, 64, 66, 68, 70 can be assigned a special measurement signal.

The fabrication of the device 50 could be done, for example, as follows: A fabrication of the qubits 54, 56, 58, 60, 62, 64, 66, 68, 70 is performed with doping of the diamond layer material 52 followed by first and second annealing steps according to DE 10 2019 117 423.6, wherein the steps of contacting with the backside contact 94 and contacting with the first wires 74, 76, 78, 86, 88, 90 are suitably integrated into this fabrication process.

More precisely, a backside contact 94 of tungsten is produced here on a suitable substrate material 96 by deposition, for example sputtering, and a diamond layer 52 is arranged thereon, for example by gas phase deposition. This diamond layer 52 is doped with sulfur or another dopant in accordance with DE 10 2019 117 423.6 and subjected to a first tempering step at around 1000° C.

Then nitrogen is implanted to generate the qubits 54, 56, 58, 60, 62, 64, 66, 68, 70, whereby for the precise positioning of the qubits 54, 56, 58, 60, 62, 64, 66, 68, 70 the nitrogen is implanted with an AFM tip. This method is described in principle, for example, in the article "Nanoscale Engineering and Optical Addressing of Single Spins in Diamond", S. Pezzagna et al., Small 2010, 6, 19, 2117-2121. For orientation purposes, auxiliary markings in the form of graphite marks or metal wires can be arranged outside the surface area to be provided with the qubits 54, 56, 58, 60, 62, 64, 66, 68, 70.

After a second tempering step at about 800° C., the first wires 74, 76, 78 of the layer 80, for example made of silver, are drawn with the aid of an AFM tip on the surface 72 of the diamond material 52 and corresponding contact surfaces (not shown) are created. A suitable electrical insulator layer 82, such as, for example, made of SiO 2, is then arranged on the surface 72 of the diamond material 52, as a result of which the first wires 74, 76, 78 are covered. Finally, the first wires 86, 88, 90 of the second layer 92 are arranged on the surface 84 of the insulating layer 82, also by drawing with the AFM tip.

Wire drawing with the AFM tip can be carried out in accordance with the procedure basically described in the publication "Atomic force microscope integrated with a scanning electron microscope for correlative nanofabrication and microscopy" by I. W. Rangelow et al., J. Vac. Technol. B 36 (6), November/December 2018. In addition, markers or auxiliary wires can be used for orientation. As an alternative to wire drawing with an AFM tip, mask-based methods can again be used to generate the first wires 74, 76, 78, 86, 88, 90, these masks preferably being removed each time to keep the distance between the wires as small as possible 74, 76, 78, 86, 88, 90 and the respectively assigned qubits 54, 56, 58, 60, 62, 64, 66, 68, 70.

It has become clear from the above illustration that the present disclosure enables qubits 14, 16, 54, 56, 58, 60, 62, 64, 66, 68, 70 to be addressed in a simple manner without the risk of crosstalk between different qubits 14, 16, 54, 56, 58, 60, 62, 64, 66, 68, 70. From the above description, it is clear that the present disclosure enables addressing of qubits 14, 16, 54, 56, 58, 60, 62, 64, 66, 68, 70 in a simple manner without the risk of crosstalk between different qubits 14, 16, 54, 56, 58, 60, 62, 64, 66, 68, 70. Addressing can be done individually or collectively for different qubits 14, 16, 54, 56, 58, 60, 62, 64, 66, 68, 70. In addition, easy readout n of qubits 14, 16, 54, 56, 58, 60, 62, 64, 66, 68, 70 is also possible.

Unless otherwise stated, all features of the present disclosure can be freely combined with one another. Also, unless otherwise indicated, the features described in the figure description may be freely combined with the other features as features of the disclosure. A restriction of individual features of examples to combination with other features of other examples is thereby expressly not intended. In addition, objective features of the device can also be used as process features in a reformulated form, and process features can be used as objective features of the device in a reformulated form. Such a reformulation is thus automatically disclosed.

Feature 1 includes a method of addressing at least one qubit (14, 16, 54, 56, 58, 60, 62, 64, 66, 68, 70) in a set of two or more qubits (14, 16, 54, 56, 58, 60, 62, 64, 66, 68, 70), characterized in that the qubit to be addressed (14, 16, 54, 56, 58, 60, 62, 64, 66, 68, 70) is exposed to an electromagnetic field, while at the same time another qubit of the set of qubits (14, 16, 54, 56, 58, 60, 62, 64, 66, 68, 70) is exposed to an electromagnetic counter field in such a way that the electromagnetic field has no effect on the other qubit (14, 16, 54, 56, 58, 60, 62, 64, 66, 68, 70) or that the electromagnetic field has a different effect on the other qubit (14, 16, 54, 56, 58, 60, 62, 64, 66, 68, 70) than on the qubit to be addressed (14, 16, 54, 56, 58, 60, 62, 64, 66, 68, 70).

Feature 2 includes a method according to feature 1, characterized in that electromagnetic near fields are used as the electromagnetic field and as the electromagnetic counter field, the electromagnetic near fields preferably being magnetic near fields which in particular have a frequency in the microwave range and/or or kilohertz range.

Feature 3 includes a method according to features 1 and 2, characterized in that color centers, preferably NV centers in diamond (12, 52), are used as qubits (14, 16, 54, 56, 58, 60, 62, 64, 66, 68, 70).

Feature 4 includes a method according to any one of the features 1-3, characterized in that the electromagnetic fields and electromagnetic counter fields are generated by electromagnetic sources (20, 22, 74, 76, 78, 86, 88, 90), preferably electrically conductive structures, in particular lines, metallizations or wires (20, 22, 74, 76, 78, 86, 88, 90) are provided, wherein the electrically conductive structures (20, 22, 74, 76, 78, 86, 91 88, 90) have a smaller dimension than the distance between adjacent qubits (14, 16, 54, 56, 58, 60, 62, 64, 66, 68, 70).

Feature 5 includes a method according to anyone of the features 1-4, characterized in that the qubits (14, 16, 54, 56, 58, 60, 62, 64, 66, 68, 70) consist in a transparent material (12; 52), so that a formatting of the qubits (14, 16, 54, 56, 58, 60, 62, 64, 66, 68, 70), preferably a simultaneous formatting of several, in particular all qubits (14, 16, 54, 56, 58, 60, 62, 64, 66, 68, 70), can be carried out by means of an optical radiation, preferably a LASER radiation.

Feature 6 includes a device for addressing at least one qubit (14, 16, 54, 56, 58, 60, 62, 64, 66, 68, 70) in a set of two or more qubits (14, 16, 54, 56, 58, 60, 62, 64, 66, 68, 70), characterized in that means (20, 22, 74, 76, 78, 86, 88, 90) for generating an electromagnetic field, which are designed in such a way that the qubit (14, 16, 54, 56, 58, 60, 62, 64, 66, 68, 70) to be addressed can be exposed to the electromagnetic field, and in that means (20, 22, 74, 76, 78, 86, 88, 90) exist for generating at least one electromagnetic counter field, which are designed such that at least one other qubit of the set of qubits (14, 16, 54, 56, 58, 60, 62, 64, 66, 68, 70) can be exposed to an electromagnetic counter field in such a way that the electromagnetic field has no effect on the other qubit (14, 16, 54, 56, 58, 60, 62, 64, 66, 68, 70) or that the electromagnetic field has a different effect on the other qubit (14, 16, 54, 56, 58, 60, 62, 64, 66, 68, 70) than on the qubit to be addressed (14, 16, 54, 56, 58, 60, 62, 64, 66, 68, 70).

Feature 7 includes a device according to feature 6, characterized in that the device is adapted to carry out the method according to anyone of the features 1-4.

Feature 8 includes a device according to features 6 or 7, characterized in that electromagnetic sources (20, 22; 74, 76, 78, 86, 88, 90), preferably first electrically conductive structures, in particular lines, wires (20, 22; 74, 76, 78, 86, 88, 90) or metallizations, exist for generating the electron-magnetic fields and electromagnetic counter-fields, each qubit (14, 16; 54, 56, 58, 60, 62, 64, 66, 68, 70) being assigned at least one electromagnetic source.

Feature 9 includes a device according to feature 8, characterized in that a plurality of electromagnetic sources (20, 22, 74, 76, 78, 86, 88, 90) are arranged in a layer, the qubits (14, 16, 54, 56, 58, 60, 62, 64, 66, 68, 70) having a distance perpendicular to this layer from the respectively associated electromagnetic source of at most 30 nm, preferably of at most 20 nm, in particular in the range 0 nm to 10 nm, and/or the qubits (14, 16, 54, 56, 58, 60, 62, 64, 66, 68, 70) projected onto this layer have a distance from the respectively associated electromagnetic source (20, 22; 74, 76, 78, 86, 88, 90) of at most 20 nm, preferably of at most 10 nm, in particular in the range 0 nm to 5 nm.

Feature 10 includes a device according to one of features 8 and 9, characterized in that at least one first electrically conductive structure (20, 22; 74, 76, 78, 86, 88, 90) can optionally be connected to an electromagnetic excitation and a photoelectron detection.

Feature 11 includes a device according to any one of features 8-10, characterized in that at least a second electrically conductive structure (24, 94), preferably a second electrically conductive wire (24), consists of a line or metallization or an electrode (94), which forms the ground for reading out the qubits (14, 16, 54, 56, 58, 60, 62, 64, 66, 68, 70), the second electrically conductive structure (24) preferably being arranged adjacent to a first electromagnetic source (20, 22), in particular at a distance in a plane of at most 40 nm, preferably at most 30 nm, in particular in a range from 10 nm to 20 nm.

Feature 12 includes a device according to any one of features 8-11, characterized in that the first electrically conductive structures (20, 22; 74, 76, 78, 86, 88, 90) and/or the second electrically conductive structures (24) i) have a cross-section with a longitudinal dimension of less than 50 nm, preferably of less than 20 nm, in particular in the range 1 nm to 10 nm, and/or ii) have a length of less than 50 nm, preferably of less than 30 nm, in particular of 5 nm to 20 nm.

Feature 13 includes a device according to any one of features 6-12, characterized in that the qubits (14, 16, 54, 56, 58, 60, 62, 64, 66, 68, 70) are arranged one-, two- or three-dimensions and/or in that the electrically conductive structures (20, 22, 74, 76, 78, 86, 88, 90) are arranged in one, two or three dimensions, there preferably being two or more layers (80, 92) in which electrically conductive structures (74, 76, 78, 86, 88, 90) are arranged, in particular parallel to one another, the electrically conductive structures (74, 76, 78, 86, 88, 90) of different layers (80, 92) being arranged differently, whereby an electrical insulator (82) preferably being arranged between two layers (80, 92).

Feature 14 includes a method of manufacturing a device according to any one of features 6-13, characterized in that two or more qubits (14, 16, 54, 56, 58, 60, 62, 64, 66, 68, 70) are created in a surrounding material and first electrically conductive wires (20, 22, 74, 76, 78, 86, 88, 90) are arranged on the surrounding material.

Feature 15 includes a method according to feature 14, characterized in that one of the following steps is carried out:

Selection of a diamond layer (12; 52) as the surrounding material;

Doping of the surrounding material with a dopant, preferably sulfur, phosphorus or oxygen;

Carrying out a first annealing step after doping;

Carrying out a second annealing step after the generation of the qubits (14, 54, 56, 58, 60, 62, 64, 66, 68, 70); and Applying second electrically conductive wires (24) for reading out the qubits (14, 16, 54, 56, 58, 60, 62, 64, 66, 68, 70).

LIST OF REFERENCE SYMBOLS 10 an example of the device according to the disclosure
12 diamond bulk material
14, 16 qubits
18 surface of the diamond material 12
20, 22 first electrically conductive wires made of ITO (Indium-Tin-Oxide)
24 second electrically conductive wire made of tungsten
26 contact surfaces of wires 20, 22, 24
50 an example of the device according to the disclosure 52 diamond layer material
54, 56, 58 qubits
60, 62, 64 qubits
66, 68, 70 qubits
72 surface of diamond material 52
74, 76, 78 first electrically conductive wires made of ITO (indium-tin-oxide)
80 first layer in which the wires 74, 76, 78 are arranged
82 insulator layer
84 surface of the insulator layer 82
86, 88, 90 first electrically conductive wires made of ITO (indium-tin-oxide)
92 second layer in which the wires 86, 88, 90 are arranged
94 back side contact made of tungsten
96 substrate

What is claimed is:

1. A device comprising:
a set of two or more qubits; and electromagnetic sources; wherein: the electromagnetic sources are electrically conductive structures; and the device is configured to carry out a method of addressing at least one qubit to be addressed in the set of two or more qubits, comprising:
exposing the qubit to be addressed to an electromagnetic field; and at a same time exposing another qubit of the set of two or more qubits to an electromagnetic counter field in such a way that the electromagnetic field has no effect on the other qubit or that the electromagnetic field has a different effect on the other qubit than on the qubit to be addressed;
wherein the electrically conductive structures are lines, wires, or metallizations;
wherein the electrically conductive structures generate the electromagnetic field and the electromagnetic counter field;
wherein each qubit is assigned to at least one electromagnetic source;
wherein the electromagnetic sources are arranged in a layer; and
wherein the qubits have a distance perpendicular to the layer from the respectively associated electromagnetic source of at most 30 nm, and/or the qubits projected onto this layer have a distance from the respectively associated electromagnetic source of at most 20 nm.

2. The device according to claim 1, wherein: the qubits have a distance perpendicular to the layer from the respectively associated electromagnetic source in a range of 0 nm to 10 nm; and/or the qubits projected onto this layer have a distance from the respectively associated electromagnetic source in a range of 0 nm to 5 nm.

3. The device according to claim 1, wherein at least a first electrically conductive structure of the electrically conductive structures is connected to an electromagnetic excitation element and a photoelectron detection element.

4. The device according to claim 3, wherein: at least a second electrically conductive structure of the electrically conductive structures forms a ground for reading out the qubits; and the second electrically conductive structure is arranged adjacent to the first electrically conductive structure at a distance in a plane of at most 40 nm.

5. The device according to claim 4, wherein the first electrically conductive structure and/or the second electrically conductive structure has a cross-section with a longitudinal dimension of less than 50 nm.

6. The device according to claim 1, wherein:
the qubits are arranged one-, two-or three-dimensions and/or the electrically conductive structures are arranged in one, two or three dimensions;
there are two or more layers in which electrically conductive structures are arranged;
the electrically conductive structures are parallel to one another; and
the electrically conductive structures of different layers are arranged differently to each other; whereby an electrical insulator is arranged between two layers.

* * * * *